(12) United States Patent
Mizukami et al.

(10) Patent No.: US 9,064,779 B2
(45) Date of Patent: *Jun. 23, 2015

(54) SEMICONDUCTOR RECTIFIER

(71) Applicant: Kabushiki Kaisha Toshiba, Minato-ku (JP)

(72) Inventors: Makoto Mizukami, Kanagawa (JP); Takashi Shinohe, Kanagawa (JP); Johji Nishio, Tokyo (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/955,059

(22) Filed: Jul. 31, 2013

(65) Prior Publication Data

US 2013/0313573 A1 Nov. 28, 2013

Related U.S. Application Data

(62) Division of application No. 12/716,386, filed on Mar. 3, 2010.

(30) Foreign Application Priority Data

Jan. 21, 2010 (JP) ................................ 2010-011300

(51) Int. Cl.
*H01L 29/15* (2006.01)
*H01L 29/16* (2006.01)
(Continued)

(52) U.S. Cl.
CPC .......... *H01L 29/1608* (2013.01); *H01L 29/861* (2013.01); *H01L 29/0619* (2013.01); *H01L 29/0692* (2013.01); *H01L 29/45* (2013.01); *H01L 29/872* (2013.01)

(58) Field of Classification Search
CPC .. H01L 29/1608; H01L 29/861; H01L 29/872
USPC .............. 257/77, E29.104, E29.327, E29.338
See application file for complete search history.

(56) References Cited

U.S. PATENT DOCUMENTS 6,340,836 B1    1/2002    Shikata
6,979,863 B2 * 12/2005    Ryu ............................... 257/335

(Continued)

FOREIGN PATENT DOCUMENTS

JP    10-321879    12/1998
JP    2000-312011    11/2000

(Continued)

OTHER PUBLICATIONS

Office Action issued Feb. 7, 2012 in Japanese Application No. 2010-011300 filed Jan. 21, 2010 (w/English translation).

*Primary Examiner* — Robert Huber
(74) *Attorney, Agent, or Firm* — Oblon, McClelland, Maier & Neustadt, L.L.P.

(57) ABSTRACT

A semiconductor rectifier includes a first conductivity type wide bandgap semiconductor substrate having a first conductivity type wide bandgap semiconductor layer on an upper surface of which is formed a plurality of first wide bandgap semiconductor regions of the first conductivity type sandwiching a plurality of second wide bandgap semiconductor regions of a second conductivity type, and a plurality of third wide bandgap semiconductor regions of the second conductivity type, at least a part of the third wide bandgap semiconductor regions being connected to the second wide bandgap semiconductor regions and each of the third wide bandgap semiconductor regions having a width smaller than that of the second wide bandgap semiconductor regions. A first electrode is formed on the first and second wide bandgap semiconductor regions and a second electrode is formed on a lower surface of the wide bandgap semiconductor substrate.

4 Claims, 13 Drawing Sheets

(51) Int. Cl.
  *H01L 29/861* (2006.01)
  *H01L 29/872* (2006.01)
  *H01L 29/06* (2006.01)
  *H01L 29/45* (2006.01)

(56) References Cited

U.S. PATENT DOCUMENTS 7,855,131 B2  12/2010  Fujiwara et al.
8,227,811 B2 *  7/2012  Mizukami et al. ............ 257/77

2003/0020133 A1  1/2003  Dahlqvist et al.
2007/0278609 A1  12/2007  Harris et al.
2008/0296587 A1 *  12/2008  Yamamoto et al. ............ 257/77
2009/0008651 A1  1/2009  Okuno et al.
2009/0269908 A1  10/2009  Fujiwara et al.

FOREIGN PATENT DOCUMENTS

JP   2009-266969   11/2009
JP   2010-087483   4/2010

* cited by examiner

SEMICONDUCTOR RECTIFIER

CROSS-REFERENCE TO RELATED APPLICATION

This application is a division of and claims the benefit of priority under 35 U.S.C. §120 from U.S. Ser. No. 12/716,386 filed Mar. 3, 2010, and claims the benefit of priority under 35 U.S.C. §119 from Japanese Patent Applications No. 2010-011300 filed Jan. 21, 2010, the entire contents of each of which are incorporated herein by reference.

FIELD OF THE INVENTION

The present invention relates to a high-endurance-voltage semiconductor rectifier using a wide bandgap semiconductor.

BACKGROUND OF THE INVENTION

As a semiconductor rectifier which rectifies an input current to output the rectified current, a PiN diode having a p-n junction and a Schottky barrier diode (SBD) having a carrier potential barrier obtained by a difference between work functions of a semiconductor layer and a metal are known. Also, a Junction Barrier Schottky barrier diode (JBS) in which an impurity region (for example, p-type) having a conductivity type different from that of a semiconductor layer (for example, n-type) is arranged on the semiconductor layer surface to moderate an electric field applied to the semiconductor layer/metal interface in a Schottky barrier diode is known. Furthermore, a Merged PiN-diode Schottky-diode (MPS) in which a contact between an impurity region (for example, p-type) and a metal in a JBS is made an ohmic contact or close to an ohmic contact so as to cause minority carrier injection when a voltage exceeding a built-in potential (Vbi) between the impurity region and the semiconductor layer is applied, thereby obtaining a decrease of a resistance due to the conductivity modulation is known.

On the other hand, a wide bandgap semiconductor typified by, for example, silicon carbide (to be also be referred to as SiC hereinafter) is expected as a power semiconductor device material of next generation. The wide bandgap semiconductor has a band gap wider than that of Si, and has a breakdown electric field strength and a heat conductivity which are higher than those of Si. By utilizing the characteristics, a power semiconductor device with low loss and capable of operating at a high temperature can be realized.

In the MPS, by lowering a voltage which causes conductivity modulation, a reduction of resistance of forward bias characteristics can be realized and a large amount of current can be discharged by a low forward voltage when a forward surge current flows into the MPS. When a current larger than that in a stationary state flows into the MPS, the current causes crystal breakdown or junction breakdown of an electrode or the like by heat generation based on the energy equation: current×voltage=energy. However, if a large current can flow with a low forward voltage, heat generation energy can be suppressed to make it possible to decrease a breakdown probability.

US Patent Application Publication 2007/0278609 discloses an MPS using silicon carbide which lowers a voltage causing conductivity modulation by a combination of impurity regions having different widths.

SUMMARY OF THE INVENTION

A semiconductor rectifier according to a first embodiment of the present invention incldues: a wide bandgap semiconductor substrate of a first conductivity type; a wide bandgap semiconductor layer of the first conductivity type which is formed on an upper surface of the wide bandgap semiconductor substrate and has an impurity concentration of 1E+14 atoms/cm$^3$ or more and 5E+16 atoms/cm$^3$ or less and a thickness of 20 μm or more; a first wide bandgap semiconductor region of the first conductivity type formed on a surface of the wide bandgap semiconductor layer; a second wide bandgap semiconductor region of a second conductivity type formed to be sandwiched by the first wide bandgap semiconductor region; a first electrode formed on the first and second wide bandgap semiconductor regions; and a second electrode formed on a lower surface of the wide bandgap semiconductor substrate, wherein a width of the second wide bandgap semiconductor region is 15 μm or more.

A semiconductor rectifier according to a second embodiment of the present invention includes: a wide bandgap semiconductor substrate of a first conductivity type; a wide bandgap semiconductor layer of the first conductivity type which is formed on an upper surface of the wide bandgap semiconductor substrate and has an impurity concentration of 1E+14 atoms/cm$^3$ or more and 5E+16 atoms/cm$^3$ or less and a thickness of 20 μm or more; a first wide bandgap semiconductor region of the first conductivity type formed on a surface of the wide bandgap semiconductor layer; a second wide bandgap semiconductor region of a second conductivity type formed to be sandwiched by the first wide bandgap semiconductor region; a first electrode formed on the first and second wide bandgap semiconductor regions; and a second electrode formed on a lower surface of the wide bandgap semiconductor substrate, wherein a relationship given by: $V_{lat} \geq 3 \times V_{drift}$ is satisfied, where $V_{drift}$ represents a voltage drop from a lower surface of the wide bandgap semiconductor substrate to a bottom surface of the second wide bandgap semiconductor region and $V_{lat}$ represents a voltage drop from an end portion of the second wide bandgap semiconductor layer to a middle portion in a width direction of the bottom surface of the second wide bandgap semiconductor region, in a potential distribution obtained right before minority carriers are injected from the second wide bandgap semiconductor region into the wide bandgap semiconductor layer by applying voltage across the first electrode and the second electrode.

DETAILED DESCRIPTION OF THE EMBODIMENTS

Figure 1:
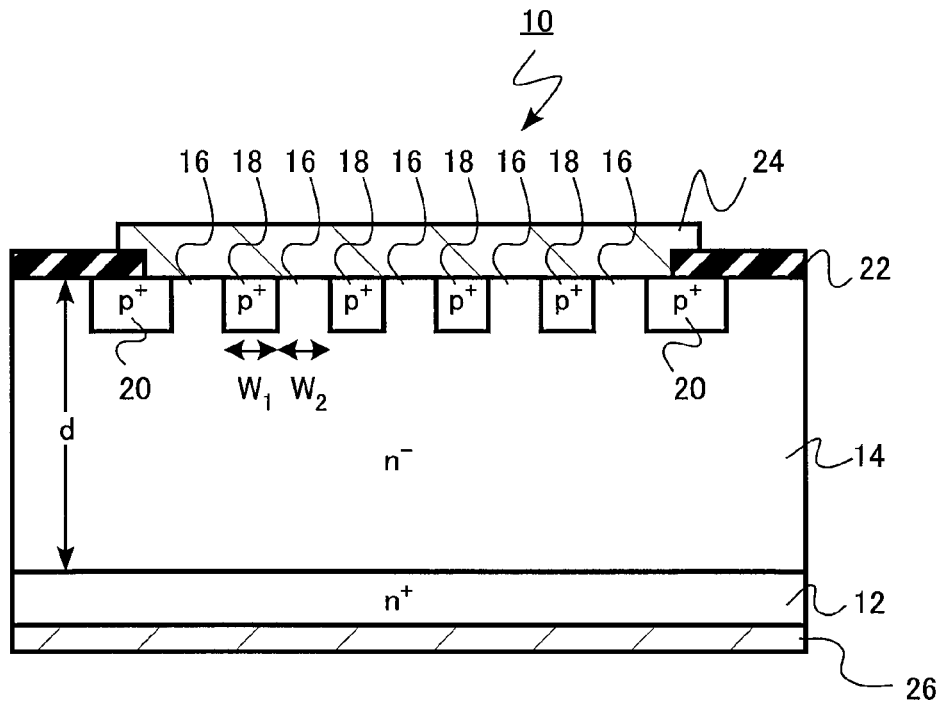
FIG. 1 is a sectional view of a semiconductor rectifier of a first embodiment.

It was cleared by the inventors that, in an MPS using a wide bandgap having a required endurance voltage (or VRRM: Maximum Repetitive Peak Reverse Voltage) of 3000 V or more (to be referred to as a 3000V-level hereinafter), a voltage at which minority carriers are injected to cause conductivity modulation (to be referred to as a hole injection voltage when minority carriers are holes hereinafter) cannot be sufficiently lowered when using a conventional structure.

For example, in a conventional Si MPS, a voltage which causes conductivity modulation is 1 to 1.5 V, while Vbi of Si=0.8 to 1.0 V. In an SiC MPS, a voltage which causes conductivity modulation is 3.2 V in an device having a 600V-level endurance voltage, and the voltage is about 4 V in a 1200-V-level device, while Vbi of SiC=2.5 to 3.0 V. Specifically, a voltage of Vbi+1 V or less is applied to inject minority carriers (SiC MPS has a p+-type impurity region width of 2 μm and an n-type Schottky region width of 0.8 μm, and when the temperature is 125° C.).

In the MPS, since a p+-type impurity region is a dead space when an electronic current (majority carrier) flows, a p+-type impurity region width is generally decreased. Therefore, a hole injection voltage of the MPS at 125° C. is calculated when a p+-type impurity region width is set to 1 μm and an n-type impurity region width (n-type Schottky region width) is set to 1 μm, for example. The calculation results are 4.4 V for a 600V-level device, 6.9 V for a 1200V-level device, 10.85 V for a 3300V-level device, and 13.53 V for a 4500V-level device. The results show that, in a high-endurance-voltage (3300V-level or more) device, a hole injection voltage is four times or more of a hole injection voltage of a PiN diode, and reduction of resistance due to conductivity modulation cannot be expected.

The present invention is made in consideration of the above circumstances. Embodiments of the present invention will be explained with reference to the accompanying drawings.

In this specification, a width of a semiconductor region means a minimum distance from a point of an end portion to a point on the opposite end across the semiconductor region in a figure which defines the semiconductor region. Also, when the width of the semiconductor region is, for example, 15 μm or more, this means that the width is 15 μm or more at the end portion having a length of 50% or more of the length of the figure which defines the semiconductor region.

(First Embodiment)

A semiconductor rectifier of the embodiment includes: a wide bandgap semiconductor substrate of a first conductivity type; a wide bandgap semiconductor layer of the first conductivity type which is formed on an upper surface of the wide bandgap semiconductor substrate and has an impurity concentration of 1E+14 atoms/cm$^3$ or more and 5E+16 atoms/cm$^3$ or less and a thickness of 20 μm or more; a first wide bandgap semiconductor region of the first conductivity type formed on a surface of the wide bandgap semiconductor layer; a second wide bandgap semiconductor region of a second conductivity type formed to be sandwiched by the first wide bandgap semiconductor region; a first electrode formed on the first and second wide bandgap semiconductor regions; and a second electrode formed on a lower surface of the wide bandgap semiconductor substrate, wherein a width of the second wide bandgap semiconductor region is 15 μm or more.

Since the semiconductor rectifier of the embodiment is configured as described above, a hole injection voltage can be sufficiently reduced, and thus resistance to a forward surge current can be improved.

An MPS in which a wide bandgap semiconductor is silicon carbide (to be also referred to as SiC hereinafter), a first conductivity type is an n type, and a second conductivity type is a p type will be exemplified.

Figure 2:
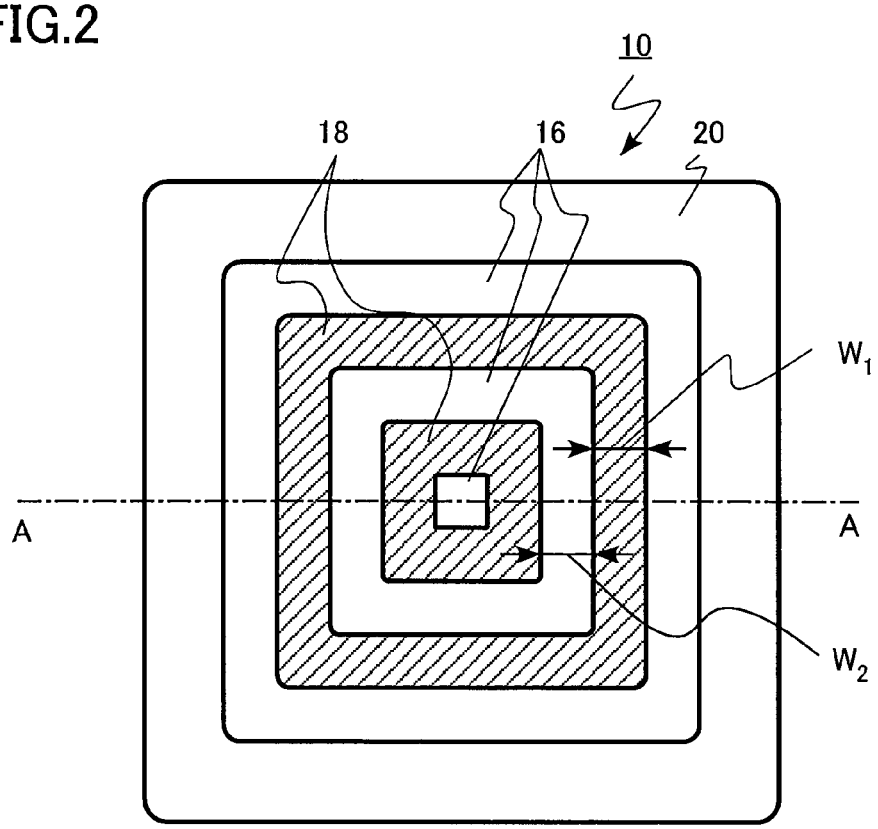
FIG. 2 is a top view of the semiconductor rectifier of the first embodiment.

FIGS. 1 and 2 are a sectional view and a top view schematically showing an MPS that is the semiconductor rectifier of the embodiment.

As shown in FIG. 1, in an MPS 10 of the embodiment, an n$^-$-type SiC layer 14 is formed as a drift layer on an upper surface of, for example, an n$^+$-type 4H—SiC substrate 12. The n$^+$-type 4H—SiC substrate 12 and the n$^-$-type SiC layer 14 contain, for example, N (nitrogen) as impurities.

The n$^+$-type 4H—SiC substrate 12 is a low-resistance substrate having an impurity concentration of, for example, 5E+18 to 1E+19 atoms/cm$^3$. The n$^-$-type SiC layer 14 has an impurity concentration of 1E+14 atoms/cm$^3$ or more and 5E+16 atoms/cm$^3$ or less and a thickness (d in FIG. 1) of 20 μm or more.

The MPS 10 is an MPS having a required endurance voltage (VRRM) of 3000 V to 7000 V, i.e., a so-called a high-endurance-voltage (3000V-level to 7000V-level) MPS. In order to realize such a high endurance voltage and a sufficient ON current density, the n$^-$-type SiC layer 14 is required to have the impurity concentration and the thickness described above.

On a surface of the n$^-$-type SiC layer 14, n-type impurity regions (n-type Schottky regions) 16 are provided. The n-type impurity regions 16 are upper portions of the n$^-$-type SiC layer 14.

p$^+$-type impurity regions 18 containing, for example, Al (aluminum) or B (boron) as impurities at a concentration of, for example, about 1E+18 atoms/cm$^3$ are formed to be sandwiched by the n-type impurity regions 16, respectively. A depth of the p$^+$-type impurity region 18 is, for example, about 0.3 to 1.0 μm. A width ($W_1$ in FIGS. 1 and 2) is 15 μm or more. A concentration of the p$^+$-type impurity region 18 is desirably set to be high as much as possible in order to make characteristics of a contact with the first electrode an ohmic contact or close to an ohmic contact.

When the width is less than 15 μm, a hole injection voltage cannot be sufficiently reduced, and thus resistance to a forward surge current cannot be improved.

On the outside of the p$^+$-type impurity region 18, a RESURF region 20 having a width larger than that of the p$^+$-type impurity region 18 and an impurity concentration and a depth which are substantially equal to those of the p$^+$-type impurity region 18 is formed. The RESURF region is provided to stabilize the endurance voltage of the MPS.

A surface of the n⁻-type SiC layer 14 is covered with an insulating layer 22 made of, for example, a silicon oxide film. At an opening of the insulating layer 22, a first electrode (anode electrode) 24 made of, for example, Ni is formed to be contacted to the n-type impurity regions 16 and the p⁺-type impurity regions 18. The first electrode (anode electrode) 24 is formed also to be in contact with a part of the surface of the RESURF region 20. On a lower surface of the n⁺-type 4H—SiC substrate 12, a second electrode (cathode electrode) 26 made of, for example, Ni is formed.

In a plan view, as shown in FIG. 2, a n-type impurity region 16 is arranged at an innermost portion, and the p⁺-type impurity regions 18 each having the width $W_1$ and the n-type impurity regions 16 each having the width $W_2$ are alternately formed toward a circumference side. In this case, the two p⁺-type impurity regions 18 having a common center, the substantially constant width $W_1$, and a square-based shape are formed.

Furthermore, on the outside of the outermost n-type impurity region 16, the RESURF region 20 is formed to surround the outermost n-type impurity region 16. The n-type impurity regions 16 and the p⁺-type impurity regions 18 surrounded by the RESURF region 20 are active regions of the MPS.

A method of manufacturing a semiconductor rectifier of the embodiment shown in FIGS. 1 and 2 will be explained. On an upper surface of the n⁺-type 4H—SiC substrate 12, the n⁻-type SiC layer 14 having a thickness (d in FIG. 2) of 20 μm or more is formed by epitaxial growth.

On the surface of the n⁻-type SiC layer 14, a mask material is patterned by a lithography method. Al or B ions are implanted into the n⁻-type SiC layer 14 by using the mask material. Thereafter, the mask material is removed, and the substrate is cleaned, and then activation annealing is performed at 1500° C. to 2000° C. In this manner, the p⁺-type impurity regions 18 and the RESURF region 20 are formed.

Thereafter, the insulating layer 22 made of, for example, a silicon oxide film is formed and patterned by a lithography method and an RIE method to partially expose the n-type impurity regions 16, the p⁺-type impurity regions 18, and the RESURF region 20. Ni is deposited by, for example, a sputtering method and patterned to form the first electrode (anode electrode) 24. On a lower surface of the n⁺-type 4H—SiC substrate 12, Ni is deposited by, for example, a sputtering method and patterned to form the second electrode (cathode electrode) 26. Thereafter, a sintering step is performed.

By the above manufacturing method, the MPS 10 shown in FIGS. 1 and 2 can be manufactured.

Figure 3:
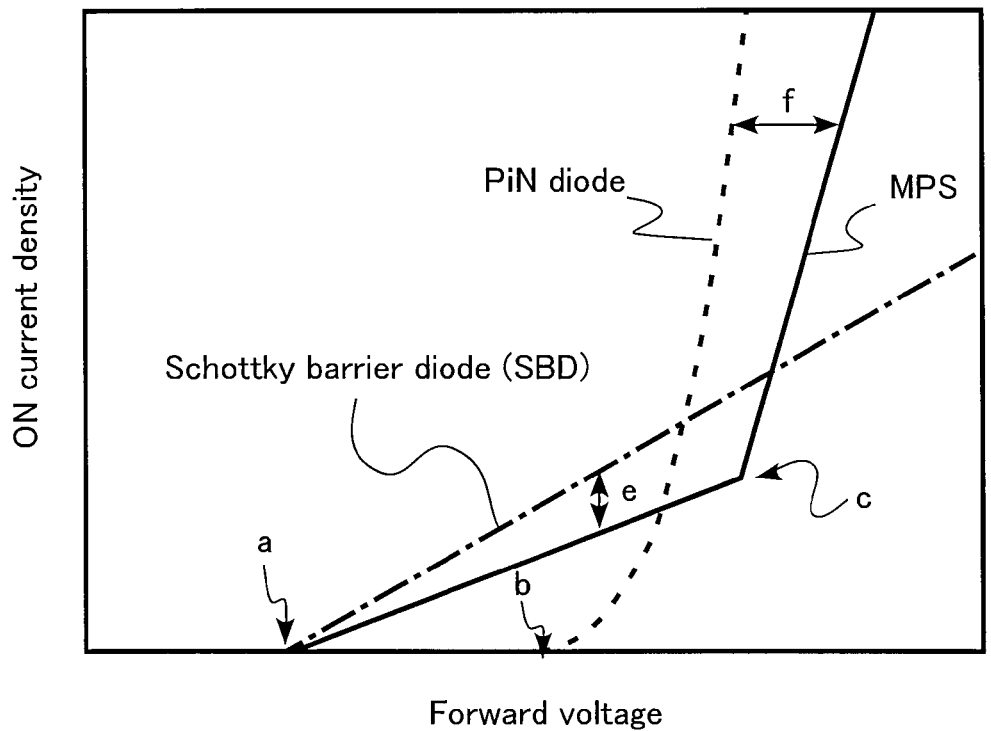
FIG. 3 is a graph for explaining relationships between forward voltage and ON current density in various semiconductor rectifiers.

FIG. 3 is a graph for explaining relationships between forward voltage and ON current density in various semiconductor rectifiers. An ON current density of an SBD indicated by an dashed-dotted line rises at a voltage indicated by an arrow a. This rise voltage is determined by a Schottky barrier height (φB) of a Schottky junction between the anode electrode and the n-type impurity region.

On the other hand, an ON current density of a PiN diode indicated by a dotted line rises at a voltage indicated by an arrow b. This rise voltage is determined by a built-in potential (Vbi) of a p-n junction.

In an MPS having both a Schottky junction and a p-n junction, an ON current density indicated by a solid line rises at a voltage indicated by an arrow a and sharply increases when the voltage reaches a voltage indicated by an arrow c at which hole injection occurs, i.e., a hole injection voltage, because conductivity modulation occurs at the voltage. When the hole injection voltage is lowered, heat generation energy can be suppressed, and a breakdown probability of the device when a forward surge current is generated can be reduced.

A difference between ON current densities of the MPS and the SBD indicated by a double-headed arrow increases when a ratio of an area of the p⁺-type impurity region formed on the MPS increases. A difference between ON current densities of an MPS and a PiN diode indicated by a double-headed arrow f decreases when a ratio of an area of the p⁺-type impurity region increases.

Figure 4:
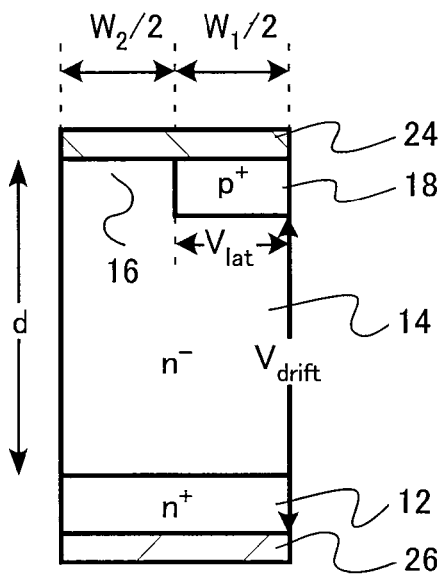
FIG. 4 is a sectional view of a structure of a semiconductor rectifier used in simulation.

FIG. 4 is a sectional view of a structure of a semiconductor rectifier used in simulation of a current-voltage characteristics. Half pitch of one of the repeated n-type impurity regions 16 and p⁺-type impurity regions 18 in the active region of an MPS is defined as a unit structure.

A half of the width of the p⁺-type impurity regions 18 is represented by $W_1/2$, and a half of the width of the n-type impurity regions 16 is represented by $W_2/2$. A thickness of the n⁻-type SiC layer 14 serving as a drift layer is represented by d. Based on the simulation, a potential distribution right before a voltage is applied across the first electrode (anode electrode) 24 and the second electrode (cathode electrode) 26 so that minority carriers are injected from the p⁺-type impurity region 18 into the n⁻-type SiC layer 14 is calculated.

Figure 5:
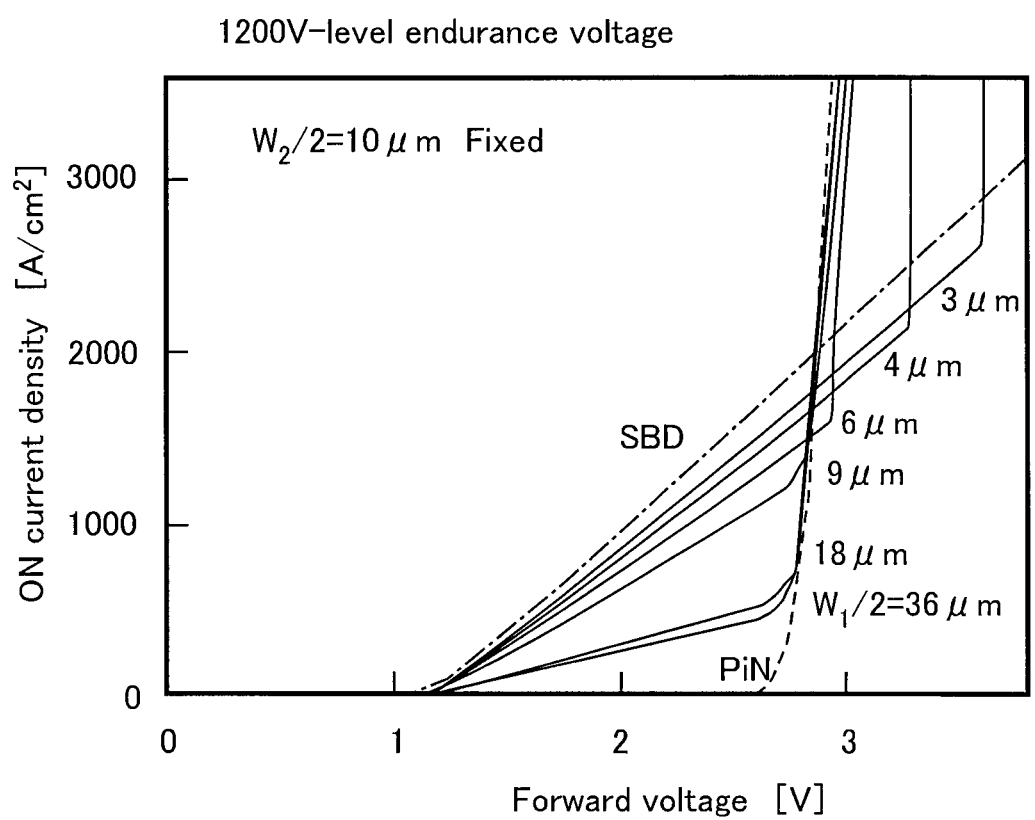
FIG. 5 is a graph showing a simulation result of a p$^+$-type impurity region width dependence of an ON current density in a conventional semiconductor rectifier.

A voltage drop from a lower surface of the n⁺-type 4H—SiC substrate 12 to a bottom surface of the p⁺-type impurity region 18 (double-headed arrow in FIG. 4) obtained by the simulation result is represented by $V_{drift}$. A voltage drop from an end portion of the p⁺-type impurity region 18 to a middle portion in a width direction of the bottom surface of the p⁺-type impurity region 18 (double-headed arrow in FIG. 4) is represented by $V_{lat}$. FIG. 5 is a graph showing a simulation result of a p⁺-type impurity region width dependence of an ON current density in a conventional semiconductor rectifier. FIG. 5 shows a simulation result of relationships between a forward voltage and an ON current density in an MPS having a 1200V-level endurance voltage. As a comparison, characteristics of an SBD and a PiN having a 1200V-level endurance voltage are also shown. A measurement temperature is 150° C.

The n⁻-type SiC layer 14 of the MPS has a thickness d of 8 μm and an impurity concentration of 6E+15 atoms/cm³. The SiC substrate 12 has a thickness of 1.0 μm and has the p⁺-type impurity region 18 having a depth of 0.6 μm. The half width of the n-type impurity regions 16 $W_2/2$ is fixed to 10 μm.

A hole injection voltage at which an ON current density of the MPS sharply rises depends on the half width of the p⁺-type impurity regions 18 $W_1/2$, and is almost equal to the voltage of the PiN diode when $W_1/2=9$ μm.

Figure 6:
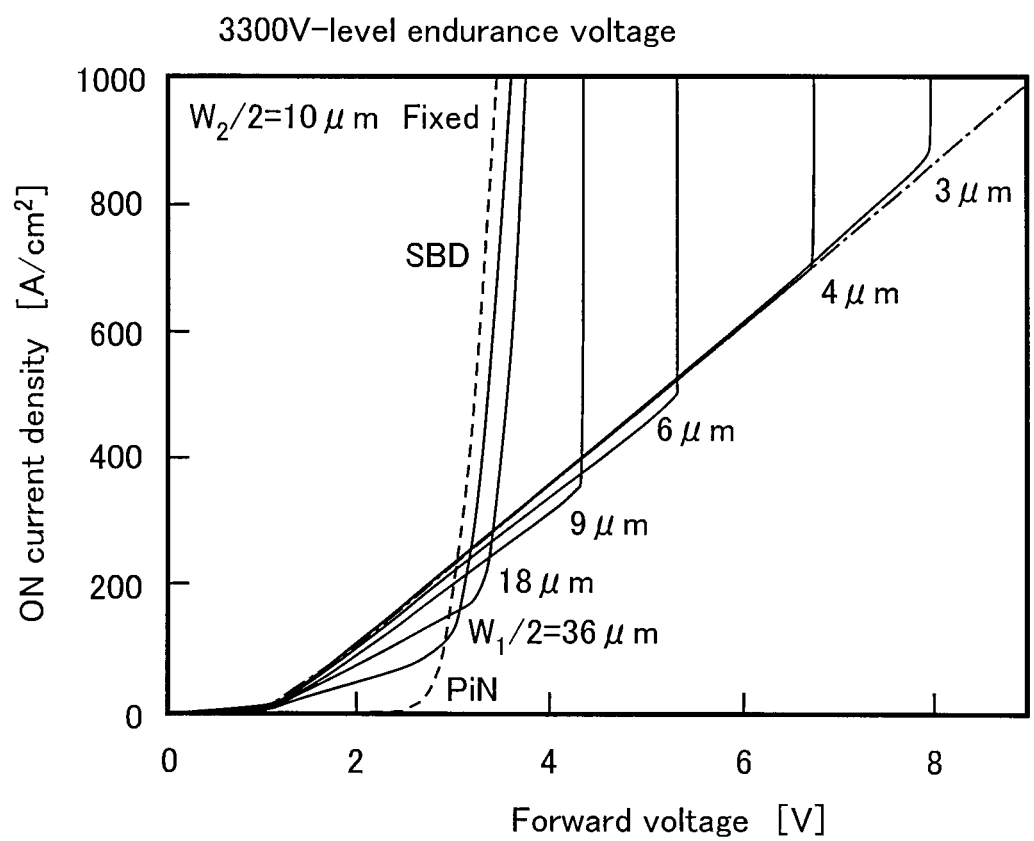
FIG. 6 is a graph showing a simulation result of a p$^+$-type impurity region width dependence of an ON current density in the semiconductor rectifier of the first embodiment.

FIG. 6 is a graph showing a simulation result of a p⁺-type impurity region width dependence of an ON current density in the semiconductor rectifier of the embodiment. FIG. 6 shows a simulation result of relationships between a forward voltage and an ON current density in an MPS having a 3300V-level endurance voltage. As a comparison, characteristics of an SBD and a PiN diode having a 3300V-level endurance voltage are also shown. A measurement temperature is 150° C.

The n⁻-type SiC layer 14 of the MPS has a thickness d of 25 μm and an impurity concentration of 4E+15 atoms/cm³. The SiC substrate 12 has a thickness of 1.0 μm and has the p⁺-type impurity regions 18 having a depth of 0.6 μm. The half width of the n-type impurity regions 16 $W_2/2$ is fixed to 10 μm.

A hole injection voltage at which an ON current density of the MPS sharply rises depends on the half width of the p⁺-type impurity regions 18 $W_1/2$, and is almost equal to the voltage of the PiN diode when $W_1/2=36$ μm.

Figure 7:
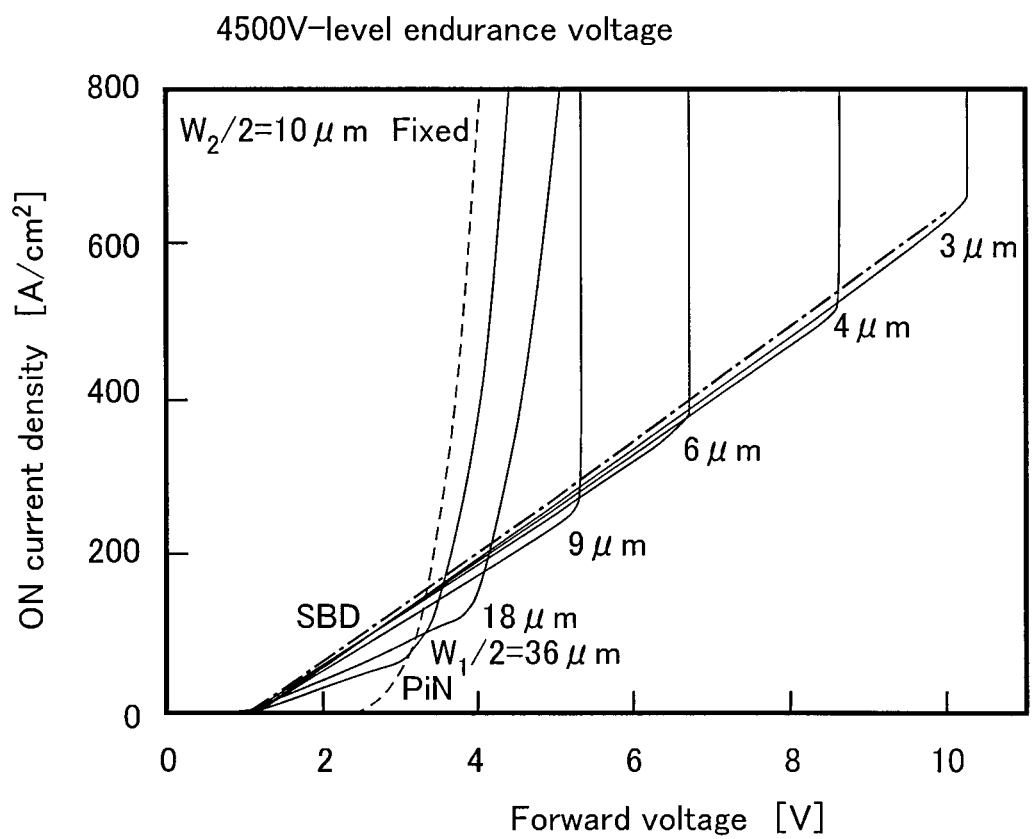
FIG. 7 is a graph showing a simulation result of a p$^+$-type impurity region width dependence of an ON current density in the semiconductor rectifier of the first embodiment.

FIG. 7 is a graph showing a simulation result of a p$^+$-type impurity region width dependence of an ON current density in the semiconductor rectifier of the embodiment. FIG. 7 shows a simulation result of relationships between a forward voltage and an ON current density in an MPS having a 4500V-level endurance voltage. As a comparison, characteristics of an SBD and a PiN diode having a 4500V-level endurance voltage are also shown. A measurement temperature is 150° C.

The n$^-$-type SiC layer 14 of the MPS has a thickness d of 35 µm and an impurity concentration of 3E+15 atoms/cm$^3$. The SiC substrate 12 has a thickness of 1.0 µm and has the p$^+$-type impurity region 18 having a depth of 0.6 µm. The half width of the n-type impurity regions 16 W$_2$/2 is fixed to 10 µm.

A hole injection voltage at which an ON current density of the MPS sharply rises depends on the half width of the p$^+$-type impurity regions 18 W$_1$/2, and is almost equal to the voltage of the PiN diode when W$_1$/2=36 µm.

As described above, according to the above simulations, in the high-endurance-voltage MPS having a endurance voltage of 3300V-level or more, the hole injection voltage can not be made almost equal to that of the PiN diode unless the width of the p$^+$-type impurity regions is increased to have a half width of about 36 µm (overall width of 72 µm).

Figure 8:
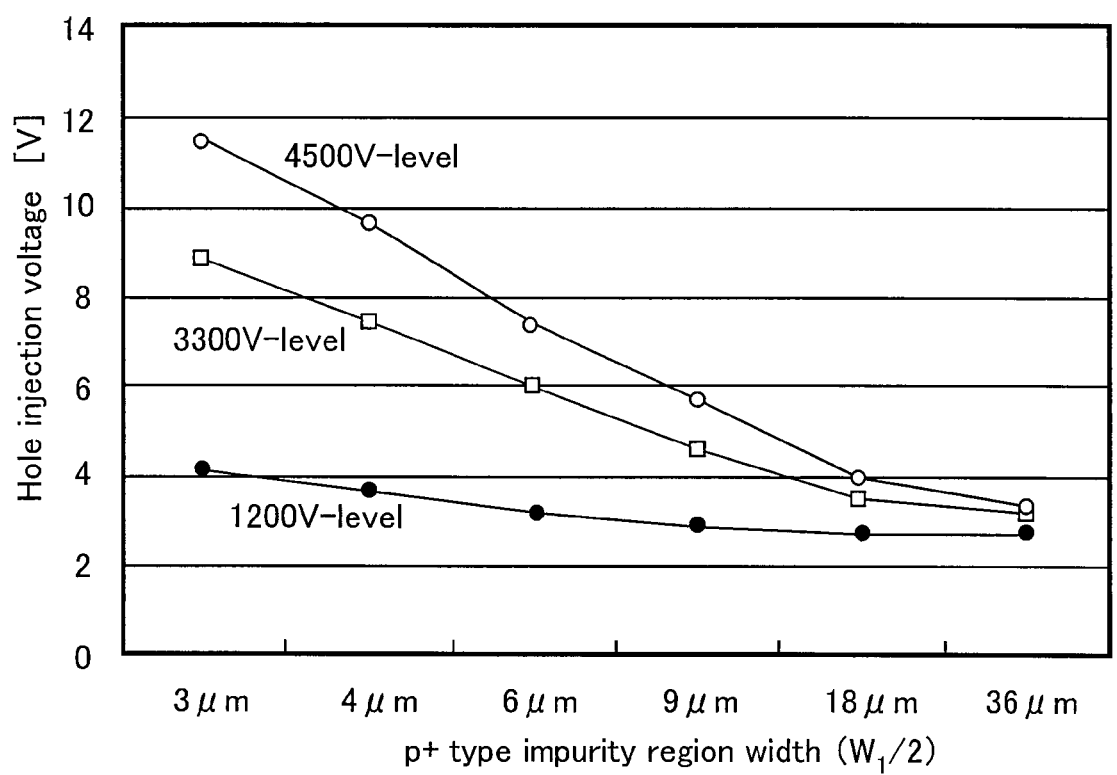
FIG. 8 is a graph showing relationships between p$^+$-type impurity region width and hole injection voltage in the semiconductor rectifier of the first embodiment.

FIG. 8 is a graph showing relationships between p$^+$-type impurity region width and hole injection voltage in the semiconductor rectifier of the embodiment. FIG. 8 is a graph obtained by integrating the results in FIGS. 5 to 7.

Compared to a low-endurance-voltage MPS having a 1200V-level endurance voltage, the p$^+$-type impurity region width dependences of the hole injection voltages in the high-endurance-voltage MPSs having a 3300V-level endurance voltage and a 4500-V-level endurance voltage are large. In the high-endurance-voltage MPSs, the dependence is almost saturated when the half width of the p$^+$-type impurity regions is about 18 µm (overall width is 36 µm).

Figure 9A:
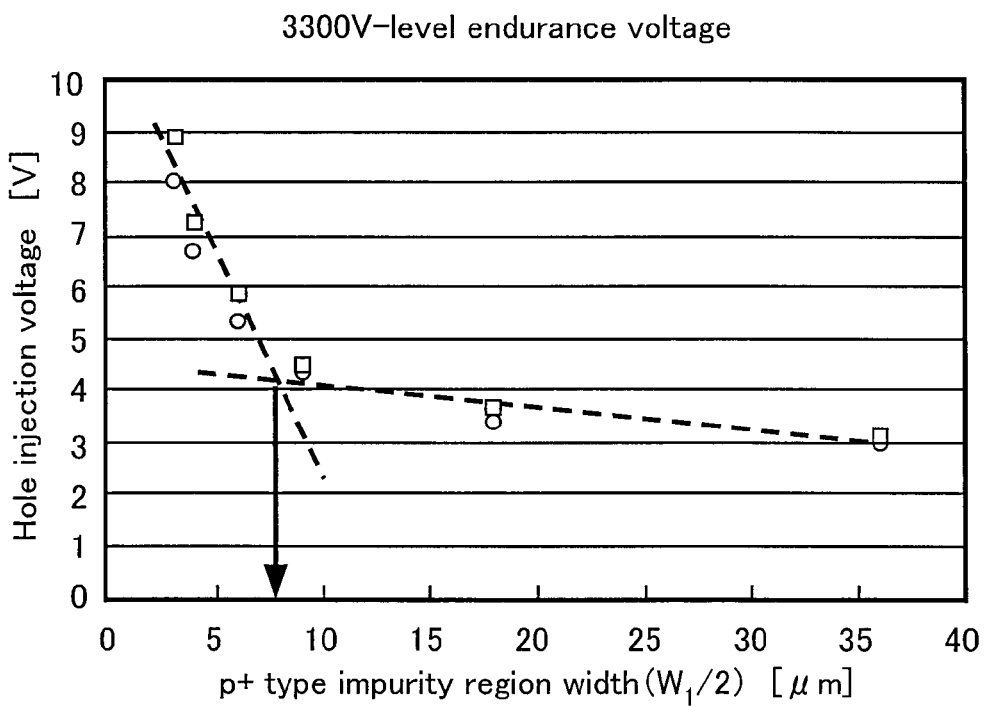
FIGS. 9A and 9B are graphs showing relationships between p+-type impurity region width and hole injection voltage in the semiconductor rectifier of the first embodiment.
Figure 9B:
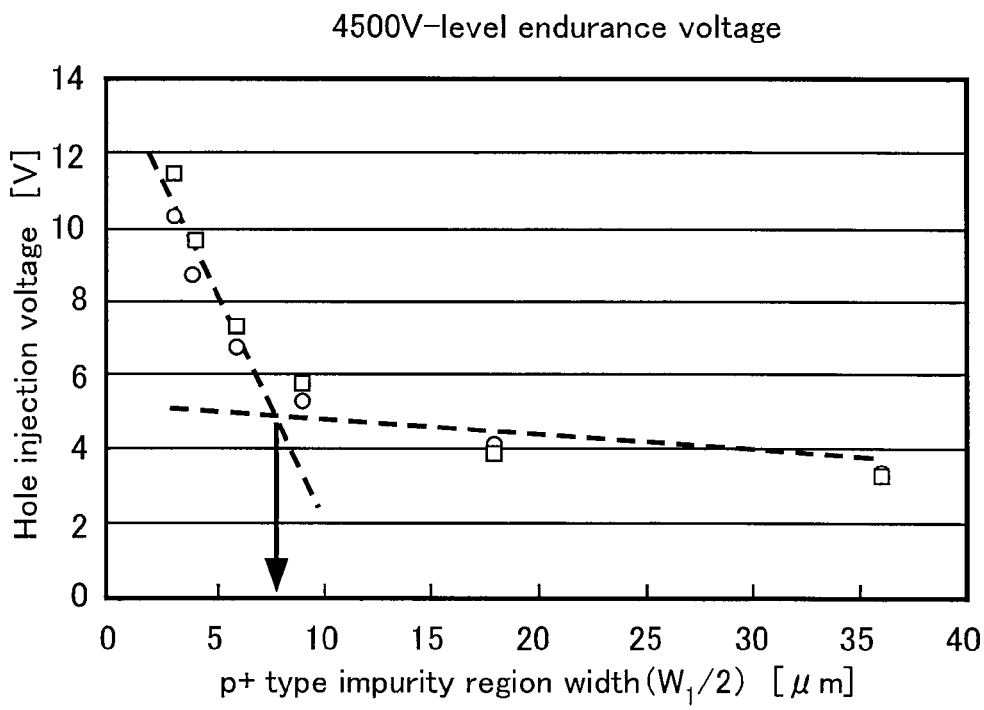

FIGS. 9A and 9B are graphs showing relationships between p$^+$-type impurity region width and hole injection voltage in the semiconductor rectifier of the embodiment. FIG. 9A shows a 3300V-level MPS, and FIG. 9B shows a 4500V-level MPS.

A result obtained at a measurement temperature of 25° C. is also shown in addition to simulation results as shown in FIGS. 6 and 7. White squares indicate a result obtained at 25° C., and white circles indicate a result obtained at 150° C. The results are plotted on abscissa axis in a linear scale, and fitted lines are indicated by dotted lines.

As is apparent from FIGS. 9A and 9B, a p$^+$-type impurity region width dependence of a hole impurity voltage is moderated when the half width of the p$^+$-type impurity regions is about 7.5 µm (overall width is 15 µm) independent of the temperature in each of the 3300V-level and 4500V-level MPSs. The dependence is almost saturated in a region in which the half width of the p$^+$-type impurity regions is 18 µm (overall width is 36 µm) or more.

Therefore, in an MPS having a high endurance voltage of 3300V-level or more, the overall width of the p$^+$-type impurity regions is required to be 15 µm or more and desirably to be 36 µm in order to reduce a breakdown probability of the device when a forward surge current is generated and to suppress a variation in breakdown probability of the device.

Figure 10:
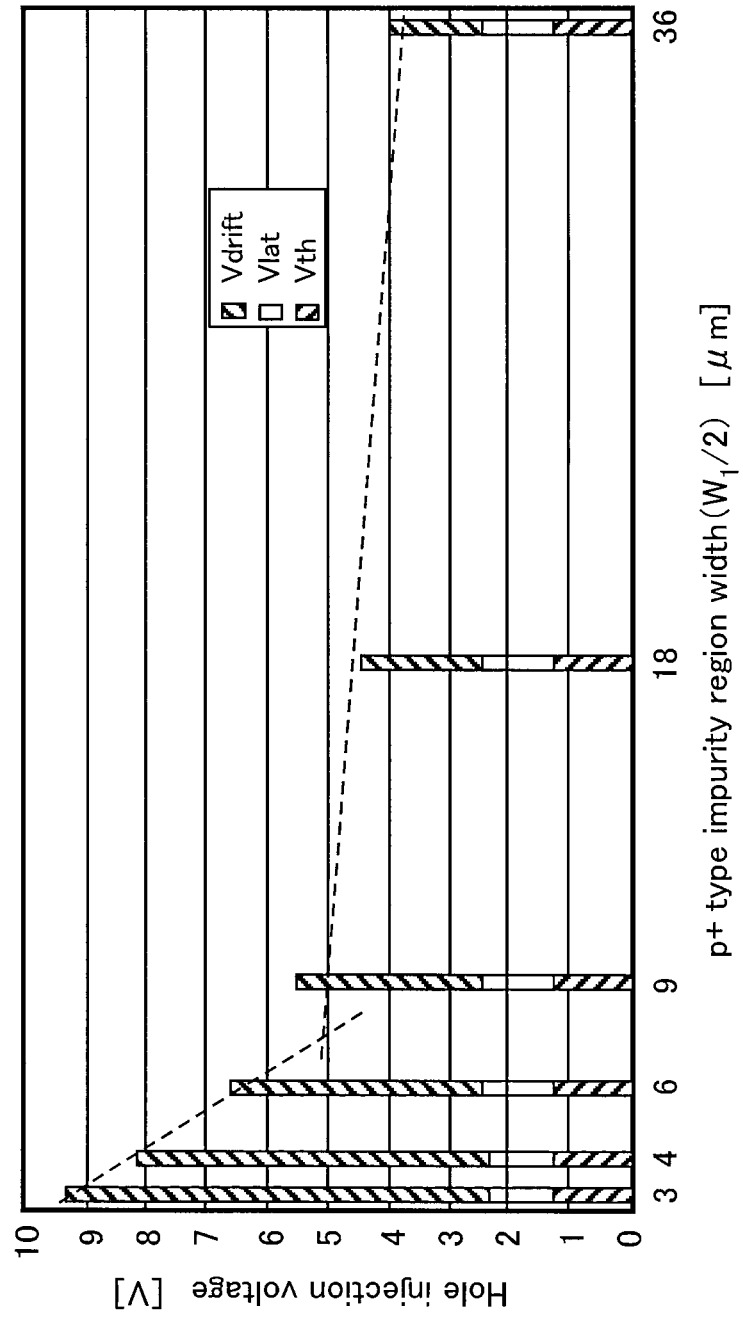
FIG. 10 is a graph showing relationships between p+-type impurity region width and components of hole injection voltage in the semiconductor rectifier of the first embodiment.

FIG. 10 is a graph showing a relationship between p$^+$-type impurity region width and a components of hole injection voltage in the semiconductor rectifier of the embodiment. A hole injection voltage is shown to be decomposed into a threshold voltage V$_{th}$ of a Schottky diode, a voltage drop V$_{lat}$ from an end portion of the p$^+$-type impurity region to a middle portion in a width direction of a bottom surface of the p$^+$-type impurity region, and a voltage drop V$_{drift}$ from a lower surface of the SiC substrate to the bottom surface of the p$^+$-type impurity region. Each of the components is obtained from a potential distribution right before hole injection, more specifically, a potential distribution when a hole injection concentration is 1E+14 atoms/cm$^3$ at the middle portion of the p$^+$-type impurity region in the width direction.

The main reason for a hole injection voltage becoming high in the MPS having a high endurance voltage of 3300V-level or more is considered that a voltage drop increases due to a drift layer having a large thickness and a low concentration. As described above, the p$^+$-type impurity region dependence of the hole injection voltage is moderated when the half width of the p$^+$-type impurity regions is about 7.5 µm (overall width is 15 µm). At this time, the following relationship:

$$V_{lat}=0.3 \times Vd_{rift}$$

is satisfied.

As described above, the dependence is almost saturated in a region in which the half width of the p$^+$-type impurity regions is 18 µm (overall width is 36 µm) or more. At this time, the following relationship:

$$V_{lat}=0.89 \times V_{drift}$$

is satisfied.

Therefore, in an MPS having a high endurance voltage of 3000V-level or more, in order to reduce a breakdown probability of an device and to suppress a variation in breakdown probability when a forward surface current is generated, the following relationship:

$$V_{lat} \geq 0.3 \times V_{drift}$$

is required to be satisfied, and the following relationship:

$$V_{lat} \geq 0.89 \times V_{drift}$$

is desirably satisfied.

When a structure of a semiconductor rectifier is determined, it can be confirmed whether the relationships are satisfied by simulating the potential distribution.

Figure 11:
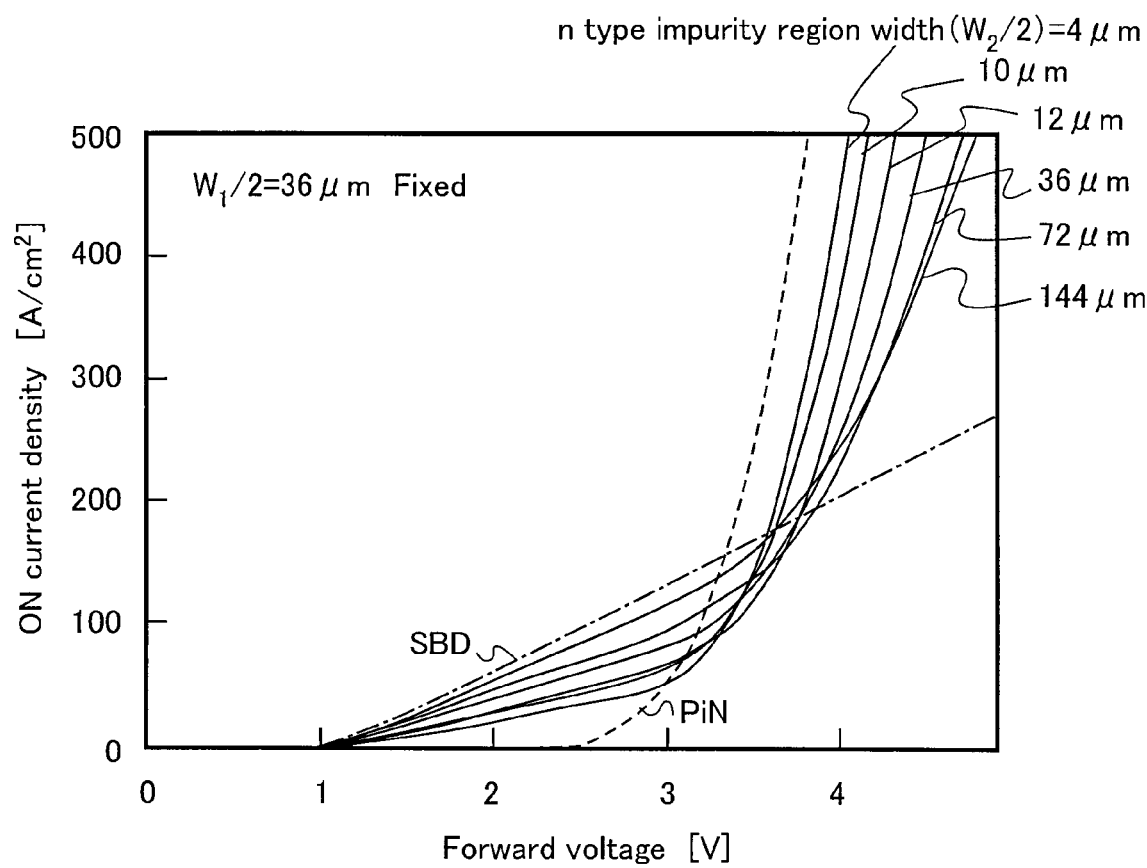
FIG. 11 is a graph showing a simulation result of an n-type impurity region width dependence on an ON current density in the semiconductor rectifier of the first embodiment.

FIG. 11 is a graph showing a simulation result of an n-type impurity region width dependence of an ON current density in the semiconductor rectifier of the embodiment. FIG. 11 shows a measurement result of a 3300V-level MPS at 150° C. The half width of the p'-type impurity regions W$_1$/2 is fixed to 36 µm.

In the region where the forward voltage is around 2 to 3 V, which is an actual operating voltage of an MPS, an ON current density gets close to that of an SBD by increasing the n-type impurity region width. Specifically, a half or more of the ON current density of the SBD can be secured when the n-type impurity region width is 36 µm (overall width is 72 µm), and the ON current density is almost equal to that of the SBD when the n-type impurity region width is 144 µm (overall width is 288 µm) or more. Therefore, in order to secure an ON current density, the p$^+$-type impurity region width is desirably 72 µm or more, and more desirably, 288 µm.

In the embodiment, in order for the semiconductor rectifier to operate as an MPS and for a surge current to effectively flow between the p$^+$-type impurity region and the n-type impurity region, it is desirable that a contact between the first electrode 24 and the n-type impurity regions 16 is Schottky-contact, and a contact between the first electrode 24 and the p$^+$-type impurity regions 18 is ohmic-contact.

As described above, according to the semiconductor rectifier of the embodiment, a large current can flow with a low forward voltage, whereby heat generation energy can be suppressed, and thus the breakdown probability of the device can be lowered. Therefore, a high-endurance-voltage semiconductor rectifier using a wide bandgap semiconductor having sufficient surge current resistance can be provided.

(Modification of the First Embodiment)

Figure 12:
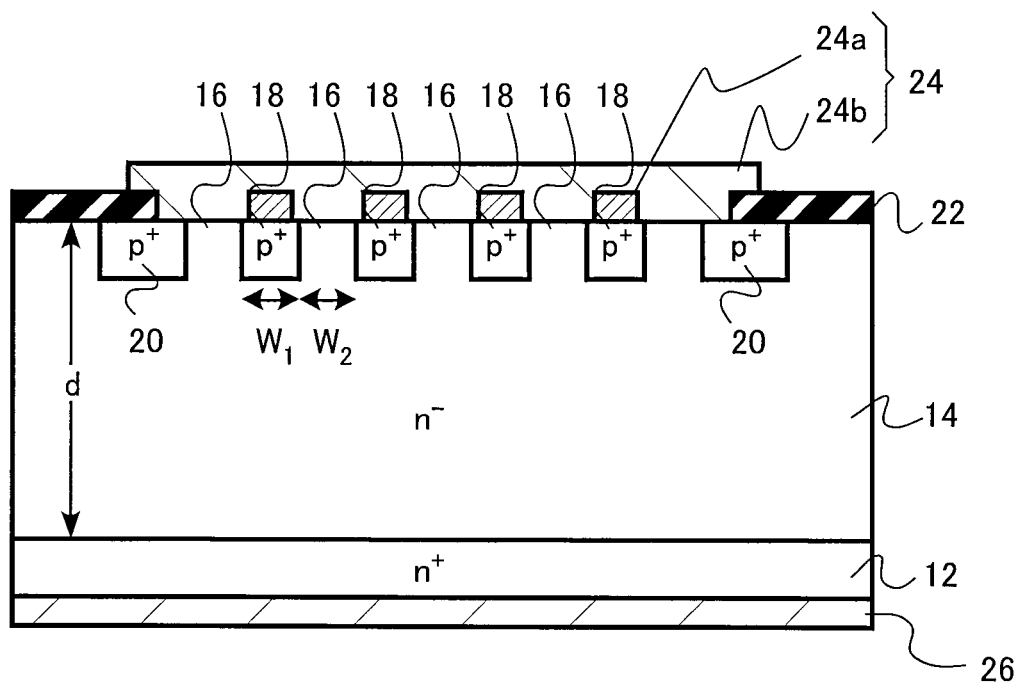
FIG. 12 is a sectional view of a semiconductor rectifier of a modification of the first embodiment.

FIG. 12 is a schematic sectional view of a semiconductor rectifier according to a modification of the first embodiment. This MPS is the same as that in the first embodiment except that the first electrode 24 includes an ohmic electrode 24a and a Schottky electrode 24b which are formed of different materials. Therefore, contents that are the same as those described in the first embodiment will not be repeated.

The ohmic electrode 24a is brought into contact with at least a part of the $p^+$-type impurity region 18. And a contact between the ohmic electrode 24a and the $p^+$-type impurity region 18 is ohmic contact. The ohmic electrode 24a is made of, for example, Ti/Al. The Schottky electrode 24b is brought into contact with the n-type impurity regions 16. And a contact between the Schottky electrode 24b and the n-type impurity regions 16 is Schotkky contact. The Schottky electrode 24b is made of, for example, Ti/Al.

By thus configuring the first electrode 24 with two electrodes, ohmic characteristics of the first electrode to the $p^+$-type impurity region 18 can be improved, and thus a high-endurance-voltage semiconductor rectifier having further improved characteristics can be provided.

The semiconductor rectifier shown in FIG. 12 can be manufactured by forming the ohmic electrode 24a by depositing, for example, Ti/Al by a sputtering method and patterning the Ti/Al film to selectively leave the Ti/Al film on the $p^+$-type impurity region 18, then forming the Schottky electrode 24b by depositing, for example, Ni by a sputtering method and patterning the Ni film, and sintering. Instead of forming a single layer first electrode 24 in the manufacturing method explained in the first embodiment.

In order to further improve the ohmic property of the ohmic electrode 24a, a surface impurity concentration of the $p^+$-type impurity regions 18 is desirably set to be high, i.e., 1E+19 to 1E+21 atoms/cm$^3$. An impurity concentration of a surface can be increased by locally ion-implanting p-type impurities into the surface of the $p^+$-type impurity regions 18.

(Second Embodiment)

A semiconductor rectifier of the embodiment includes, in addition to the configuration of the semiconductor rectifier of the first embodiment, third wide bandgap semiconductor regions of a second conductivity type having a width smaller than that of the second wide bandgap semiconductor regions. The second embodiment is the same as the first embodiment except that the third wide bandgap semiconductor regions are provided. Therefore, contents that are the same as those described in the first embodiment will not be repeated.

Since the semiconductor rectifier of the embodiment is configured as described above, regions, in which a current flows when a forward surge current is generated, can be enlarged and dispersed. Therefore, resistance to the forward surge current can be further improved.

Figure 13:
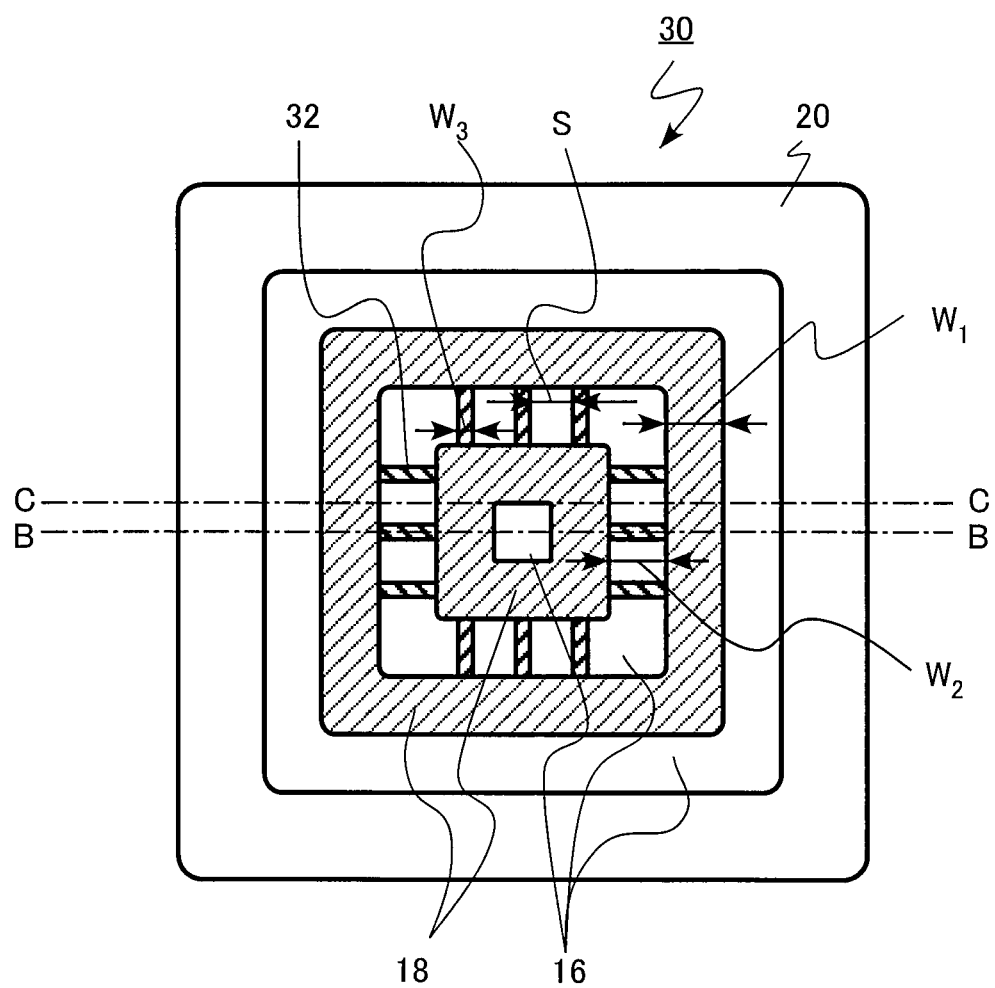
FIG. 13 is a top view of a semiconductor rectifier of a second embodiment.
Figure 14A:
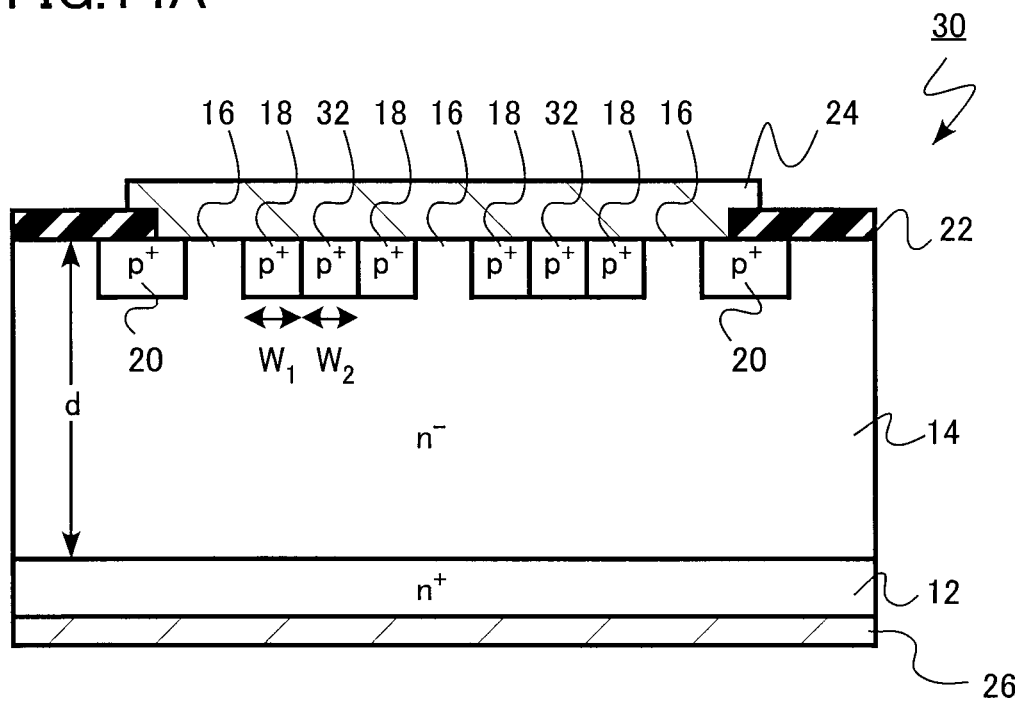
FIGS. 14A and 14B are sectional views of the semiconductor rectifier of the second embodiment.
Figure 14B:
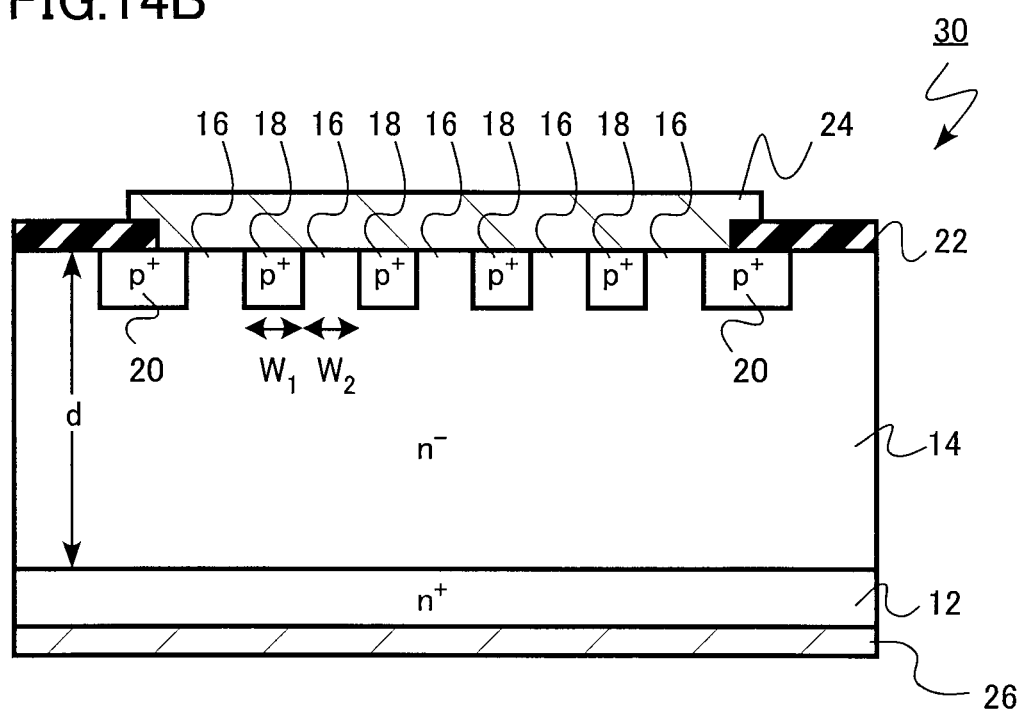

FIG. 13 and FIGS. 14A and 14B are respectively a top view and sectional views of MPS that is the semiconductor rectifier of the embodiment. FIG. 14A is a sectional view along a B-B line in FIG. 13, and FIG. 14B is a sectional view along a C-C line in FIG. 13.

As shown in FIG. 13 and FIGS. 14A and 14B, a MPS 30 of the embodiment includes, in addition to the MPS of the first embodiment, $p^+$-type propagation regions 32 each having both ends connected to the $p^+$-type impurity regions 18 and a width smaller than that of the $p^+$-type impurity regions 18.

Each of the $p^+$-type propagation regions 32 is sandwiched by the n-type impurity regions 16.

The propagation regions 32 are formed by ion-implanting Al or B similarly to the $p^+$-type impurity regions 18. The propagation regions 32 have an impurity concentration of, for example, about 1E+18 atoms/cm$^3$, and a depth of, for example, 0.3 to 1.0 µm.

Figure 15:
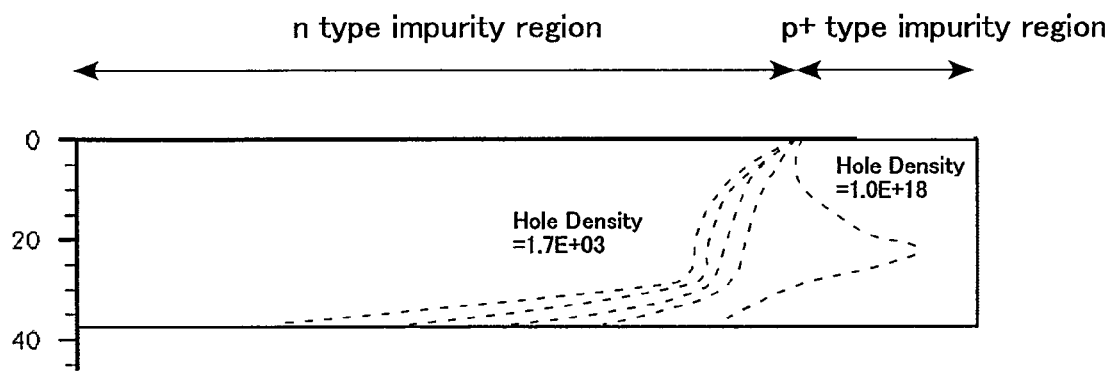
FIG. 15 is a diagram for explaining an operation of the semiconductor rectifier of the second embodiment.

FIG. 15 is a diagram for explaining an operation of the semiconductor rectifier of the second embodiment. FIG. 15 is a distribution chart of a hole injection concentration obtained by the MPS according to the first embodiment when a half width of a $p^+$-type impurity regions is 36 µm (overall width is 72 µm), and a half width of the n-type impurity regions is 144 µm (overall width is 288 µm).

As is apparent from FIG. 15, although holes are selectively injected into a lower portion of the $p^+$-type impurity region, the holes do not reach the n-type impurity region. Therefore, it is understood that a region in which heat is generated is restricted to portions in which the $p^+$-type impurity regions are provided when a forward surge current is generated. This causes local electrode peeling and/or crystal breakdown, so that a device yield may go down.

According to the embodiment, the propagation region 32 is arranged to disperse hole injection over a large area of an active region of the device. Therefore, a heat generation region can be dispersed, and local electrode peeling and/or crystal breakdown may be avoided. Thus, device yield is expected to be increased.

In addition, since the width of the propagation regions 32 is smaller than the $p^+$-type impurity regions 18, a decrease in ON current density due to forming the propagation regions 32 can be suppressed. It is confirmed that holes are propagated and the holes are injected also into the lower portions of the propagation regions 32 due to a plasma spreading effect from the $p^+$-type impurity region 18 even if the width of the propagation regions 32 is smaller than, for example, 15 µm that is required for the $p^+$-type impurity regions 18.

Furthermore, according to the embodiment, a frequency of diode operation can be increased. When a forward bias is applied to cause a forward current to flow, hole injection occurs and holes are accumulated in the drift layer. If a reverse bias is applied to spread a depletion layer in the drift layer after the forward bias is applied, the holes accumulated when the forward bias is applied are required to be discharged. At this time, a hole discharge port is the anode electrode through the $p^+$-type impurity region. In the embodiment since a propagation regions sandwiched by the $p^+$-type impurity regions are formed, the number of effective hole discharge ports increases. Therefore, the holes are easily discharged, and a frequency of diode operation can be increased.

Figure 16:
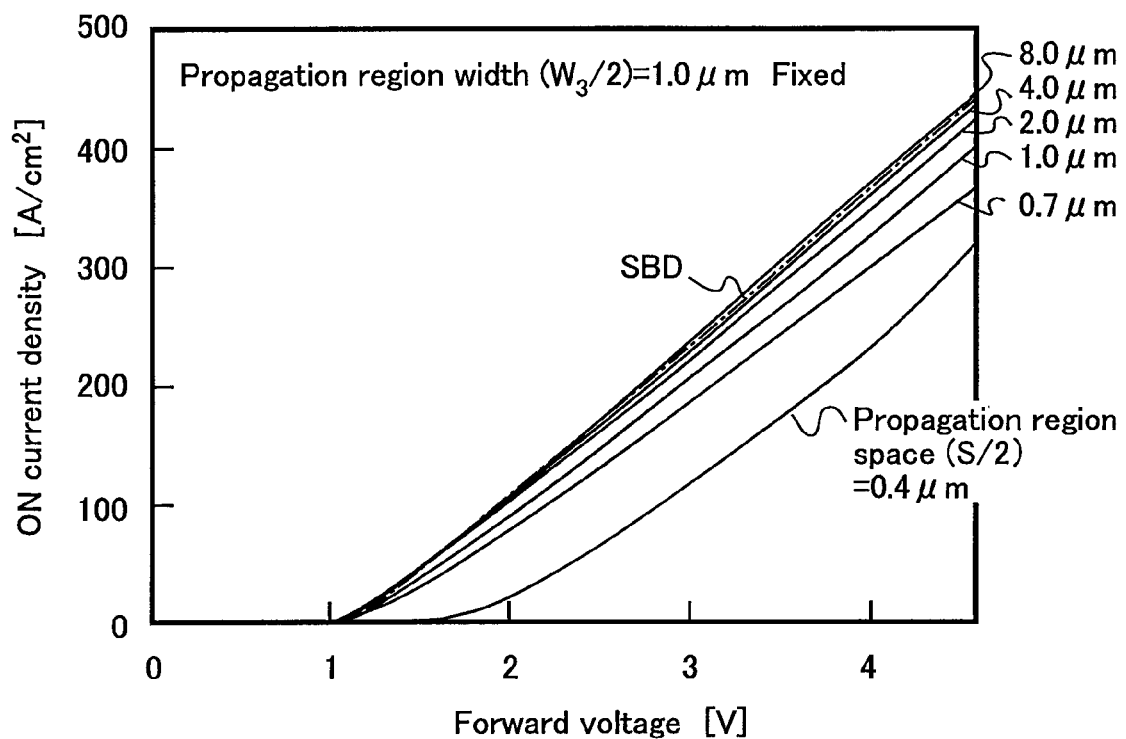
FIG. 16 is a graph showing a simulation result of a propagation region space dependence of an ON current density in the semiconductor rectifier of the second embodiment.

FIG. 16 is a graph showing a simulation result of a propagation region space dependence of an ON current density in the semiconductor rectifier of the second embodiment. The simulation is executed using a simplified structure including only the propagation regions and the n-type impurity regions. The half width of the propagation regions 32 ($W_3/2$) is fixed to 1.0 µm. A half of a propagation region space (S/2: see FIG. 13) is used as a variable. For comparison, the simulation result in an SBD having no propagation region is also shown.

As is apparent from FIG. 16, when a half of the propagation region space is 4.0 µm or more, an ON current density is almost equal to that of an SBD having no propagation region. Therefore, in order to secure an ON current density, the overall of the propagation region space is desirably 8.0 µm or more.

The propagation region width is desirably 0.5 µm or more. This is because a stable impurity region may be difficult to be formed when the propagation region width is less than 0.5 µm.

The structure in which both ends of each of the propagation regions are connected to the p+-type impurity regions are explained as an example. However, holes can be propagated when a part of the propagation region is connected to the p+-type impurity region. Therefore, a structure in which one end of the propagation region is connected to the p+-type impurity region may be employed.

In the embodiment, in order to operate the semiconductor rectifier as an MPS and cause a surge current to effectively flow between the p+-type impurity regions and the n-type impurity regions, it is desirable that a contact between the first electrode 24 and n-type impurity regions 16 is Schottky-contact, a contact between the first electrode 24 and the p+-type impurity regions 18 is ohmic-contact, and a contact between the first electrode 24 and the propagation regions 32 is ohmic-contact.

As described above, according to the semiconductor rectifier of the embodiment, in addition to the effect of the first embodiment, a heat-generation region when a forward surge current is generated can be dispersed. Therefore, a high-endurance-voltage semiconductor rectifier using a wide bandgap semiconductor having further improved surge current resistance can be provided.

Conventionally, in a mode in which a PiN diode is used with a low current, holes are suddenly eliminated when a backward bias is switched to a forward bias due to a low hole injection density, and thus a large oscillatory waveform is disadvantageously generated. For this reason, time for the oscillatory wave to be converged must be considered, which restricts increase of operation speed of an inverter or the like. However, according to the first and second embodiment, the semiconductor rectifier can be operated in a bipolar mode in which hole injection occurs at a high current density and can be operated in a unipolar mode by an electron current at a low current density. Therefore, vibration in a low-current density operation in a PiN diode, which is conventionally disadvantageous, can be suppressed, and the high-endurance-voltage semiconductor rectifier can be operated at a high speed.

The embodiments of the present invention are explained with reference to concrete examples. The embodiments are merely given as an example, and do not limit the present invention. In the explanations of the embodiments, parts which are not directly required for the explanation of the present invention are not described. However, necessary elements related to the semiconductor rectifier and the method of manufacturing a semiconductor rectifier and the like can be arbitrarily selected and used.

For example, in the embodiments, a semiconductor rectifier in which a first conductivity type is n-type and a second conductivity type is p-type, respectively is exemplified. However, a semiconductor rectifier in which a first conductivity type is p-type and a second conductivity type is n-type, may be employed.

In the embodiments, two p+-type impurity regions of square-based shape are formed. However, the shape may be, for example, a stripe having a desired width, grating, dotted shape, rectangle, hexagon, polygon, or ring shape. The number of p+-type impurity regions may be one, or more than two. However, in order to disperse a heat-generation region, the semiconductor rectifier desirably has at least a plurality of p+-type impurity regions.

In the embodiments, silicon carbide (SiC) is exemplified as a wide bandgap semiconductor. However, other wide bandgap semiconductors such as diamond, gallium nitride (GaN) can also be applied.

In the embodiments, Ni or Ti/Al is used as the material of the first electrode. However, in order to obtain a Schottky barrier height (φB) and a contact resistance required for an MPS, other materials including a simple substance such as Mo, W, Pt, Ta, or TaN, an alloy thereof, silicide, carbide, or the like can also be used.

In addition, all semiconductor rectifiers and all methods of manufacturing a semiconductor rectifier which include the devices of the present invention and can be obtained by arbitrary change of design by a person skilled in the art are included in the spirit and scope of the invention. The spirit and scope of the invention are defined by the appended claims and equivalents thereof.

What is claimed is:

1. A semiconductor rectifier, comprising:
a wide bandgap semiconductor substrate of a first conductivity type;
a wide bandgap semiconductor layer of the first conductivity type formed on an upper surface of the wide bandgap semiconductor substrate, the layer having an impurity concentration of 1E+14 atoms/cm$^3$ or more and 5E+16 atoms/cm$^3$ or less and a thickness of 20 µm or more;
a plurality of first wide bandgap semiconductor regions of the first conductivity type formed at a surface of the wide bandgap semiconductor layer;
a plurality of second wide bandgap semiconductor regions of a second conductivity type formed at a surface of the wide bandgap semiconductor layer, the plurality of second wide bandgap semiconductor regions formed to be sandwiched by the first wide bandgap semiconductor regions;
a plurality of third wide bandgap semiconductor regions of the second conductivity type formed at a surface of the wide bandgap semiconductor layer, wherein at least a part of the third wide bandgap semiconductor regions is directly connected to the second wide bandgap semiconductor regions and each of the third wide bandgap semiconductor regions has a width in a direction parallel to the surface of the wide bandgap semiconductor layer smaller than a width of each of the second wide bandgap semiconductor regions;
a fourth wide bandgap semiconductor region of the second conductivity type formed at a surface of the wide bandgap semiconductor layer, the fourth wide bandgap semiconductor region surrounding all of the second wide bandgap semiconductor regions and all of the third wide bandgap semiconductor regions;
a first electrode being in direct contact with the first, second, third and fourth wide bandgap semiconductor regions; and
a second electrode formed on a lower surface of the wide bandgap semiconductor substrate, wherein
a width in a direction parallel to the surface of the wide bandgap semiconductor layer of each of the second wide bandgap semiconductor regions is 15 µm or more.

2. The rectifier according to claim 1, wherein the width of each of the second wide bandgap semiconductor regions is 36 µm or more.

3. The rectifier according to claim 1, wherein contacts between the first electrode and the first wide bandgap semiconductor regions are Schottky contact, contacts between the first electrode and the second wide bandgap semiconductor regions are ohmic contact, and contacts between the first electrode and the third wide bandgap semiconductor regions are ohmic contact.

4. The rectifier according to claim 1, wherein the wide bandgap semiconductor is silicon carbide.

\* \* \* \* \*